(12) United States Patent
Chen

(10) Patent No.: US 12,309,938 B2
(45) Date of Patent: May 20, 2025

(54) SUBTRACTIVE METHOD FOR MANUFACTURING CIRCUIT BOARD WITH FINE INTERCONNECT

(71) Applicant: Hsu-Tung Chen, New Taipei (TW)

(72) Inventor: Hsu-Tung Chen, New Taipei (TW)

( * ) Notice: Subject to any disclaimer, the term of this patent is extended or adjusted under 35 U.S.C. 154(b) by 314 days.

(21) Appl. No.: 17/934,415

(22) Filed: Sep. 22, 2022

(65) Prior Publication Data

US 2024/0107680 A1  Mar. 28, 2024

(51) Int. Cl.
*H05K 3/02* (2006.01)
*C25D 5/48* (2006.01)
*H05K 3/04* (2006.01)
*H05K 3/42* (2006.01)

(52) U.S. Cl.
CPC ............... *H05K 3/027* (2013.01); *C25D 5/48* (2013.01); *H05K 3/04* (2013.01); *H05K 3/423* (2013.01); *H05K 2203/107* (2013.01)

(58) Field of Classification Search
None
See application file for complete search history.

(56) References Cited

U.S. PATENT DOCUMENTS 6,074,567 A * 6/2000 Kuraishi ............. H01L 21/4846
257/E23.189
2002/0076911 A1* 6/2002 Lin ...................... H01L 23/3128
257/E21.309
2007/0130761 A1* 6/2007 Kang .................... H05K 3/0094
174/262
2008/0014409 A1* 1/2008 Egitto .................... H05K 3/027
428/137
2011/0269269 A1* 11/2011 Tu ..................... H01L 23/49541
438/106

FOREIGN PATENT DOCUMENTS

| DE | 2446045 A1 | 9/1974 |
|---|---|---|
| JP | S63261780 | 10/1988 |
| JP | H02128492 | 5/1990 |
| JP | 2685443 | 12/1997 |
| JP | 2013251220 | 12/2013 |
| JP | 2018101765 A | 6/2018 |
| TW | 201826895 A | 7/2018 |

* cited by examiner

*Primary Examiner* — Allan W. Olsen
(74) *Attorney, Agent, or Firm* — Rosenberg, Klein & Lee

(57) ABSTRACT

A subtractive method for manufacturing a circuit board with fine interconnect includes steps of disposing a resist film on a metal layer on a surface of a wiring substrate, and performing a dry etching process to etch and penetrate the resist film and form a wiring pattern groove in the metal layer, the depth of the wiring pattern groove is less than the thickness of the first metal layer; further wet etching process is performed, and the metal layer is etched again from the wiring pattern groove to penetrate the metal layer to form wires in the metal layer, and finally the resist film is removed. By first using dry etching to form wiring pattern grooves in the metal layer, the thickness of the metal layer to be removed by wet etching is reduced, thereby reducing side etching generated by the wet etching process and improving the wiring quality.

7 Claims, 7 Drawing Sheets

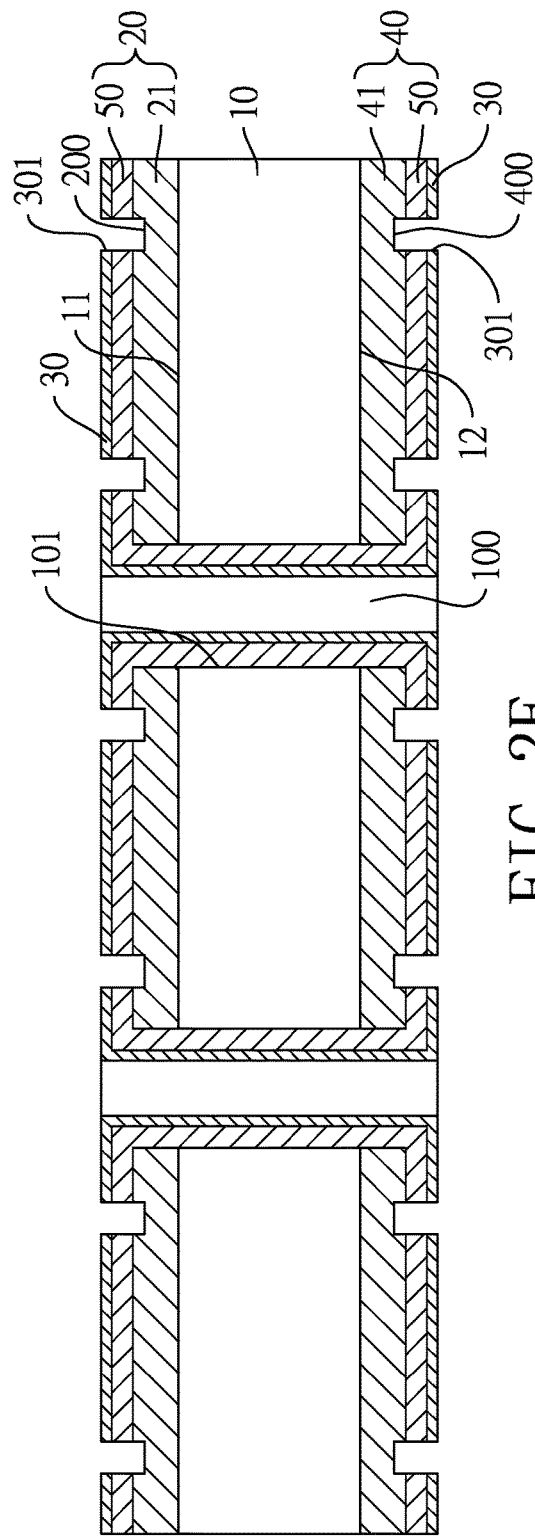
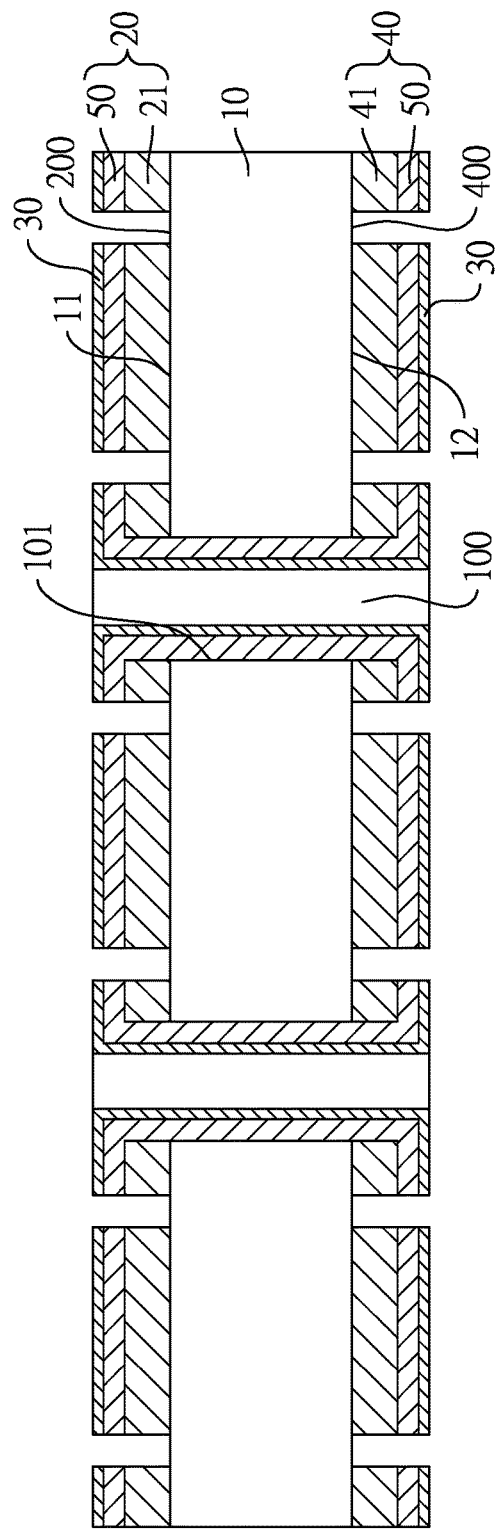
FIG. 2E
FIG. 2F

SUBTRACTIVE METHOD FOR MANUFACTURING CIRCUIT BOARD WITH FINE INTERCONNECT

BACKGROUND OF THE INVENTION

1. Field of the Invention

The present invention relates to a circuit board manufacturing method, in particular to a subtractive method for manufacturing a circuit board with fine interconnect.

2. Description of the Related Art

In the current circuit board manufacturing methods, designed wiring patterns are formed in metal layers on a wiring substrate mainly by lithography and etching. Process steps of lithography and etching are mainly to firstly dispose a photoresist layer on a metal layer on a wiring substrate, set up a patterned mask on the photoresist layer and expose the photoresist layer to form a patterned photoresist layer. Then etch the wiring substrate to remove portions of the metal layer not covered by the patterned photoresist layer, and finally remove the patterned photoresist layer to complete wiring patterns on the wiring substrate.

Wherein, in the step of etching and removing portions of the metal layer not covered by the patterned photoresist layer, the wiring substrate together with the metal layer and the patterned photoresist layer thereon are immersed in an etching solution, so that the portions of the metal layer not covered by the photoresist layer are eroded by the etching solution until the wiring substrate is reached, and thereby the wirings in the metal layer are completed.

However, the etching solution erodes the metal layer not only downwardly but also laterally, such that the bottom of the wiring pattern directly under the patterned photoresist layer is not faithfully preserved but instead is recessed inwardly, thereby compromising structural stability of the wiring pattern. In addition, in response to demands for miniaturization of circuit boards in recent years, wire diameters and spacing widths of wiring pattern designs are getting smaller and narrower, and the lateral erosions (called side etching hereinafter) of the wiring pattern caused by the etching solution are more likely to affect the interconnection stability of the wiring pattern on the wiring substrate as well as communication qualities of the finished circuit board. In other words, the side etching phenomenon of the etching solution also limits developments of miniaturization and precision of the circuit board wiring, hence circuit board manufacturing methods of the prior arts need to be further improved.

SUMMARY OF THE INVENTION

In view of the fact that current circuit board manufacturing methods tend to incur side etching when etching the wiring pattern, resulting in unstable wiring structure and restricting developments of fine wires for interconnection, the present invention provides a subtractive method for manufacturing a circuit board with fine interconnect, comprising the following steps:

preparing a wiring substrate with a first metal layer on a first surface of the wiring substrate;

disposing a resist film on the first metal layer;

performing a dry etching process to etch from a surface of the resist film towards the first surface to form an opening corresponding to a wiring pattern, and the opening penetrating the resist film and forming a wiring pattern groove in the first metal layer, wherein a depth of the wiring pattern groove is less than a thickness of the first metal layer;

performing a wet etching process to etch and penetrate the first metal layer from the wiring pattern groove of the first metal layer to form wirings in the first metal layer; and removing the resist film.

In the present invention, when wirings are to be formed on the first metal layer on the wiring substrate, a resist film is firstly disposed on a first metal layer, and then a dry etching process such as laser, ion-enhanced plasma etching and other etching processes is used. The resist film and the first metal layer are etched to form a wiring pattern groove in the first metal layer. Then, a wet etching process is performed, and etching is continued in the groove of the first metal layer until the first metal layer is penetrated, and the wirings in the first metal layer are completed.

The present invention divides the etching process for forming a wiring layer into two steps, the first step is a dry etching process, and the second step is a wet etching process. In addition to forming a patterned resist film from a resist film, the dry etching also forms a wiring pattern groove in the first metal layer to reduce the thickness of the first metal layer that needs to be removed in a subsequent step of wet etching process. As a result, compared with the prior art which directly removes the entire metal layer not covered by the photoresist layer by wet etching, the present invention already reduces the thickness of portions of the first metal layer to be removed, so that when the wet etching process is performed, the thickness of the portions of the metal layer removed by the wet etching process is reduced. Hence, extents of side etching on the first metal layer below the resist film during the wet etching process is also reduced; accordingly, the problem of unstable wiring structures caused by excessive side etching can be avoided.

In addition, with respect to generating a patterned photoresist layer with a wiring pattern by an exposure and developing process and directly performing wet etching on the wiring metal layer, dry etching such as laser etching has a deeper specified etching depth and higher precision for the specified etching path, which can efficiently form a wiring pattern groove with both a linewidth and a spacing of 20 µm or less required by the fine wire specifications, and in view of the aforementioned effectiveness of the present invention in reducing the extent of the side etching, the problem of side etching for fine wiring being more easily affected by the wet etching process can be effectively corrected. Furthermore, compared with directly penetrating the metal layer with laser etching technology to complete wire separations, the present invention also avoids the problem of junction separation at the junction between the wiring substrate and the metal layer due to high temperatures of the laser etching.

In sum, the subtractive method for manufacturing a circuit board with fine interconnect of the present invention can be utilized to manufacture fine wiring circuit boards with narrower wiring widths and pitches, and to ensure the wiring quality thereof.

BRIEF DESCRIPTION OF THE DRAWINGS

FIGS. 2A to 2G are cross-sectional views of a process flow of the subtractive method for manufacturing a circuit board with fine interconnect of the present invention.

DETAILED DESCRIPTION OF THE INVENTION

In the following, the technical solutions in the embodiments of the present invention will be clearly and fully described with reference to the drawings in the embodiments of the present invention. Obviously, the described embodiments are only a part of, not all of, the embodiments of the present invention. Based on the embodiments of the present invention, all other embodiments obtained by a person of ordinary skill in the art without creative efforts shall fall within the protection scope of the present invention.

Please refer to FIGS. 1A to 1G: the subtractive method for manufacturing a circuit board with fine interconnect of the present invention mainly includes the following steps.

Figure 1A:
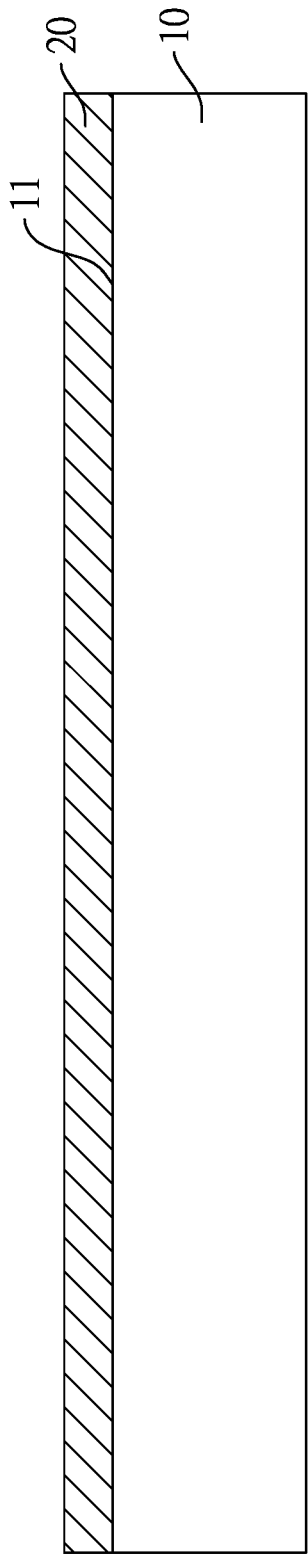
FIGS. 1A to 1E are cross-sectional views of a process flow of the subtractive method for manufacturing a circuit board with fine interconnect of the present invention.

As shown in FIG. 1A, a wiring substrate 10 is prepared, and a first surface of the wiring substrate 10 has a first metal layer 20 on it.

Figure 1B:
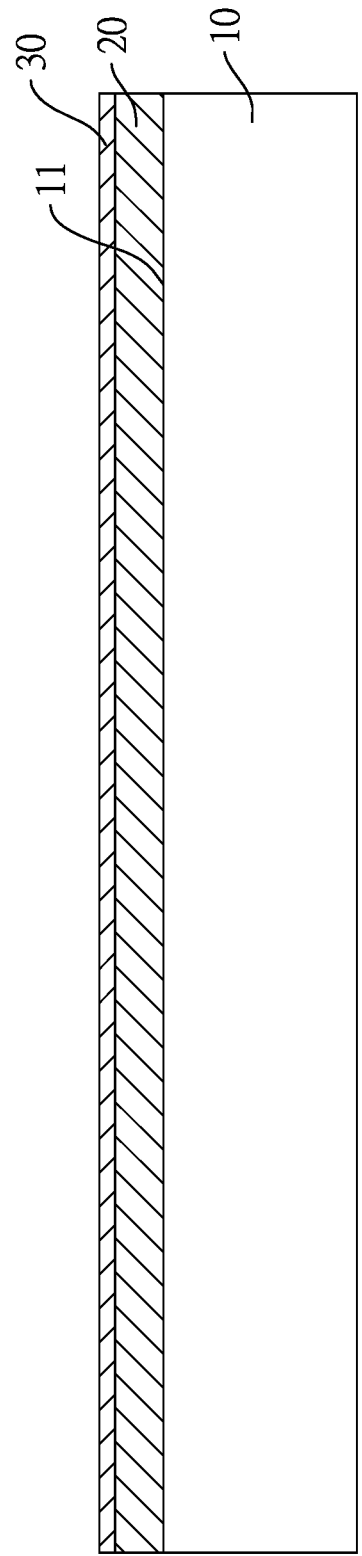

As shown in FIG. 1B, a resist film 30 is disposed on the first metal layer 20.

Figure 1C:
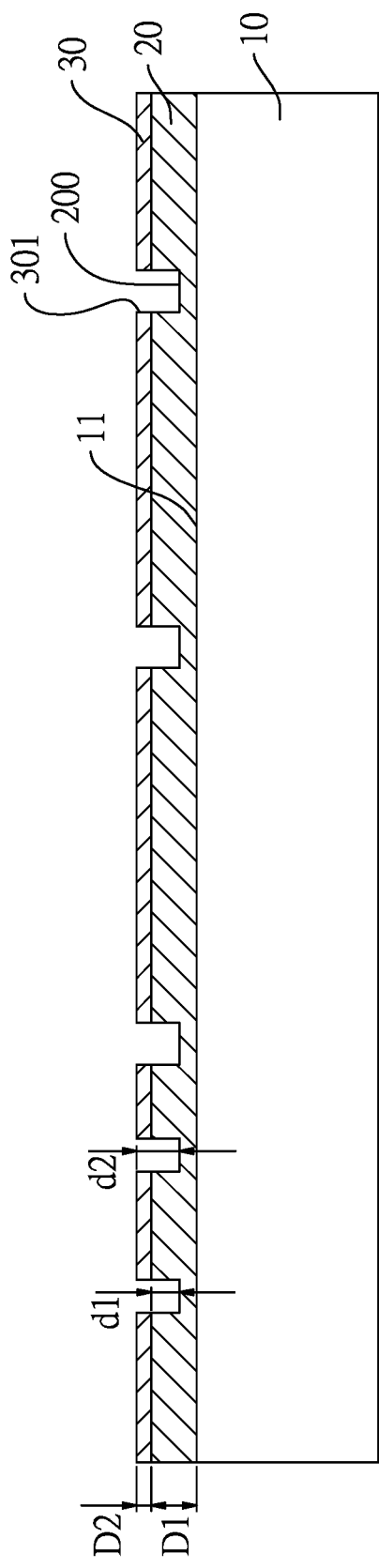

As shown in FIG. 1C, a dry etching process is performed, and etching proceeds from a surface of the resist film 30 towards the wiring substrate 10 to form an opening 301 according to a wiring pattern. As the dry etching proceeds, the opening penetrates the resist film 30, and forms a wiring pattern groove 200 in the first metal layer 20. When the dry etching process is completed, the depth d1 of the wiring pattern groove 200 is smaller than the thickness D1 of the first metal layer 20.

Figure 1D:
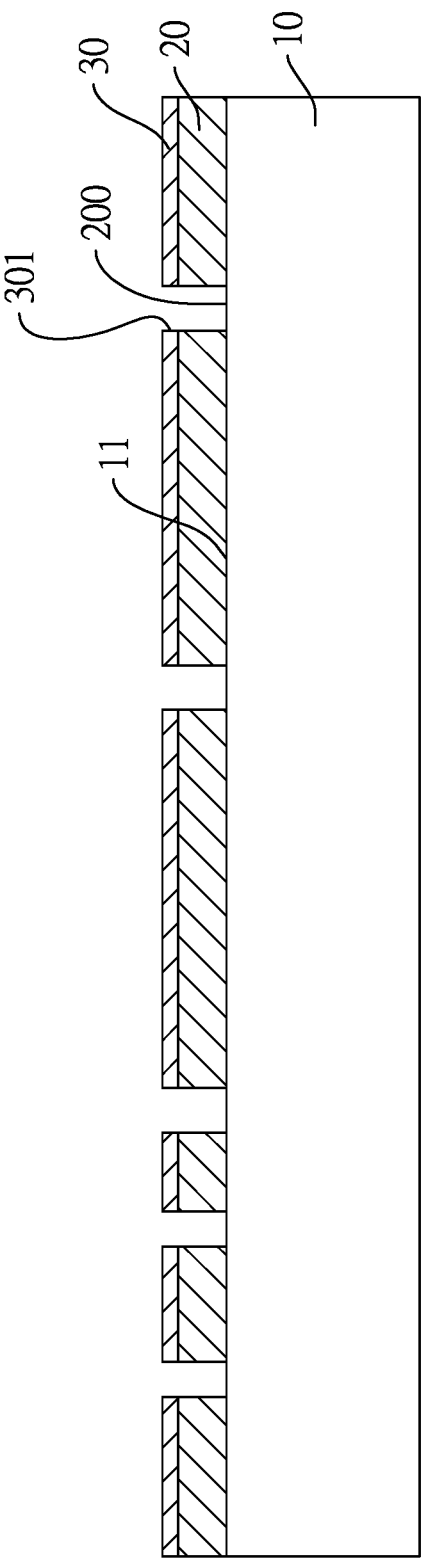

As shown in FIG. 1D, a wet etching process is then performed, and the first metal layer 20 is etched via the wiring pattern groove 200 in the first metal layer 20 to penetrate the first metal layer 20.

Figure 1E:
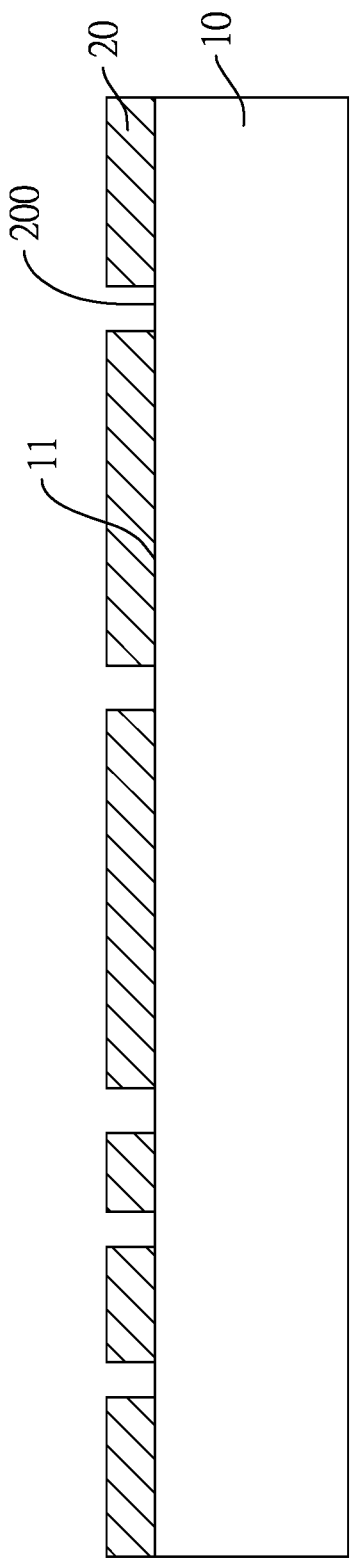

As shown in FIG. 1E, the resist film 30 is then removed. The resist film 30 is, for example, etched away by another etching process specifically for materials that the resist film 30 are made of.

Preferably, the dry etching process is a laser etching process with a specified depth controlled by a computer, and the computer not only controls the laser etching depth, but also specifies the wiring patterns of the wiring pattern groove 200 formed by the laser etching, i.e. the corresponding area that should be removed in the first metal layer 20. The depth of the laser etching not only penetrates the resist film 30, but also needs to form the wiring pattern groove 200 in the first metal layer 20. The thickness D1 of the first metal layer and the thickness D2 of the resist film 30 are known at the time of disposition, and thereby the etching depth d2 of the laser etching is set to be greater than the thickness D2 of the resist film 30 and smaller than a sum of the thickness D2 of the resist film 30 and the thickness D1 of the first metal layer 20. That is to say, the depth d2 of the laser etching is restricted not to penetrate the first metal layer 20. Preferably, the laser etching process utilizes, for example, ultraviolet laser, green laser, nanosecond laser or femtosecond laser technologies.

For example, please refer to FIG. 1C as well. Assuming the thickness D1 of the first metal layer is 6 µm, the thickness D2 of the resist film 30 is 1 µm, and the depth of the laser etching d2 can be set as 5 µm. In this way, the thickness of the remaining first metal layer 20 under the wiring pattern groove 200 is 2 µm, that is to say, when performing wet etching, it is only necessary to set the etching depth to 2 µm to complete the wiring in the first metal layer.

In the present example, after completing the deposition of the patterned photoresist layer, if the etching of the metal layer of the same specification is directly performed by wet etching as described in the prior art, it will be necessary to wet etch the metal layer by 6 µm, which will continuously cause side etching during the wet etching process. In contrast, as the present invention reduces the thickness of the metal layer to be removed by the wet etching process (only 2 µm as mentioned above), extents of the side etching occurring during the wet etching process can be greatly reduced.

Figure 2A:
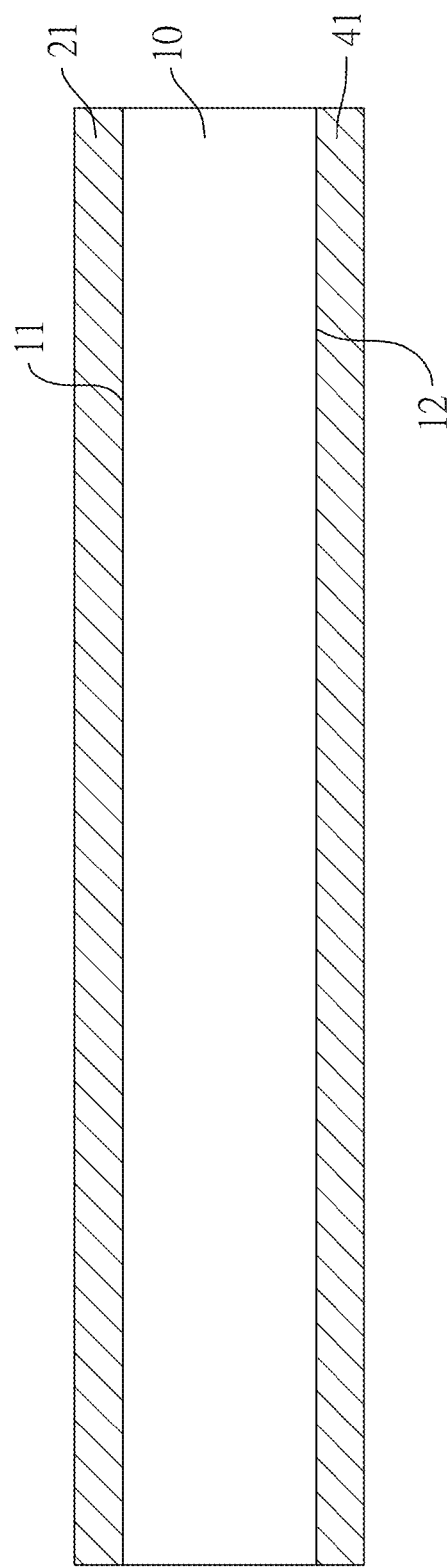
Figure 2B:
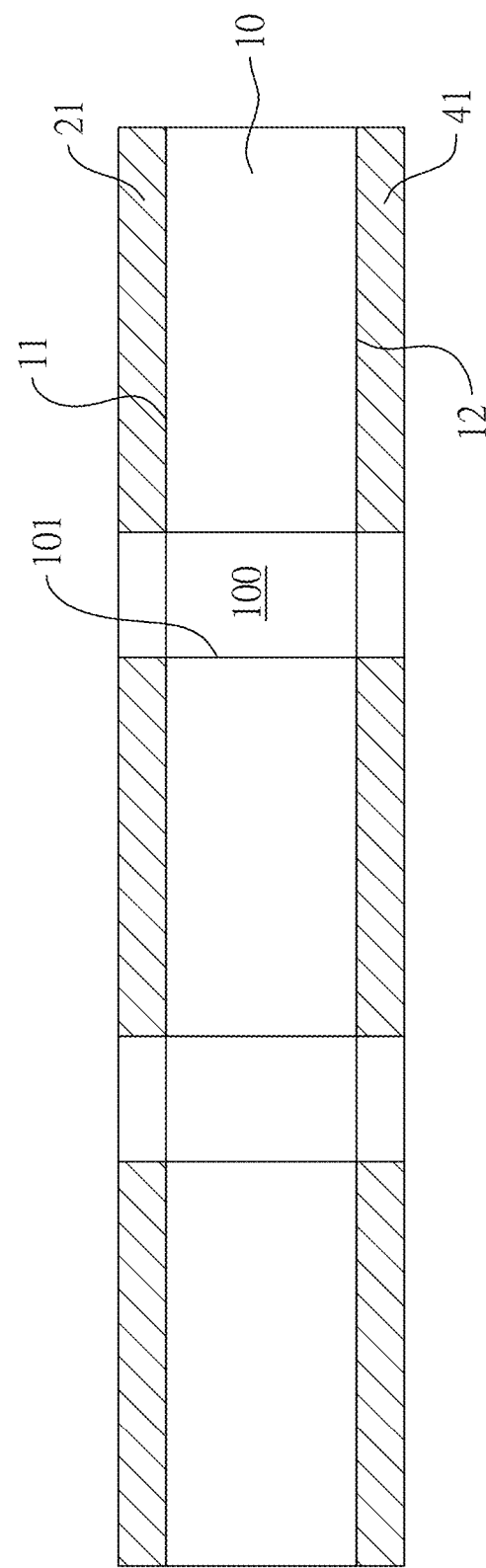
Figure 2C:
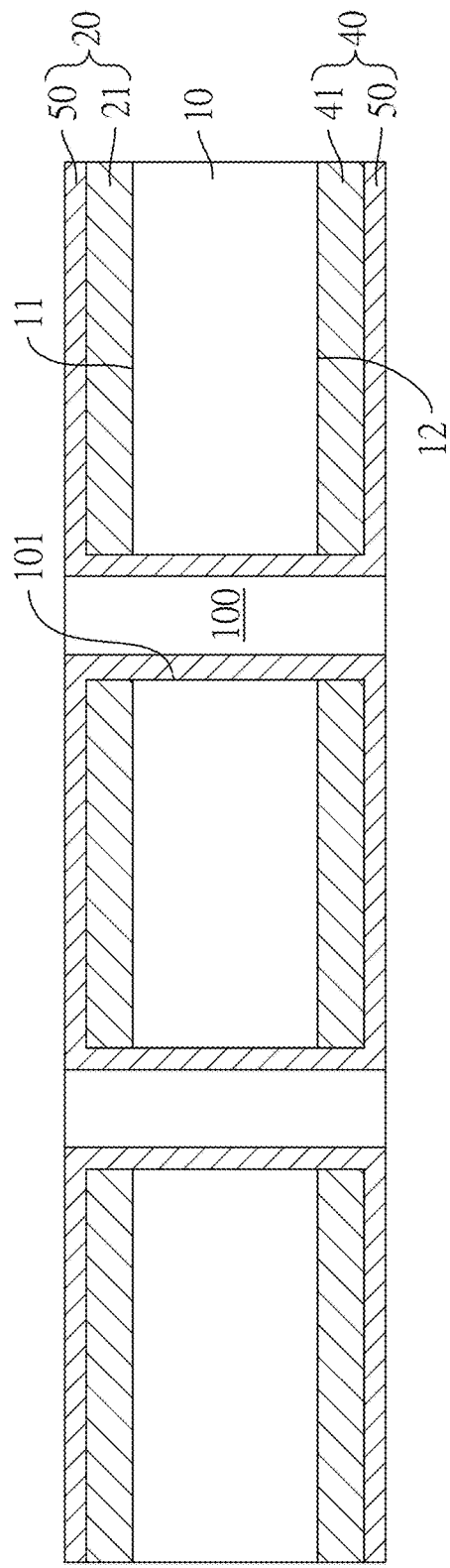

Please refer to FIGS. 2A to 2C. In a first embodiment, the subtractive method for manufacturing a circuit board with fine interconnect of the present invention can also be applied to a manufacturing process of a double-sided circuit board. In this embodiment, the wiring substrate 10 further has a second surface 12 opposite to the first surface 11, and the second surface 12 has a second metal layer 40 thereon, and the aforementioned steps of preparing the wiring substrate 10 further include the following sub-steps.

As shown in FIG. 2A, the wiring substrate 10 is provided, and metal foil layers 21 and 41 are respectively disposed on the first surface 11 and the second surface 12 of the wiring substrate 10. The metal foil layers 21 and 41 are, for example, copper foil layers pre-disposed on the first surface 11 and the second surface 12 of the wiring substrate 10 respectively, and the thicknesses of the metal foil layers 21 and 41 are preferably 3-5 µm.

As shown in FIG. 2B, a drilling process is performed to form at least one through hole 100 penetrating the wiring substrate 10 and both the metal foil layers 21 and 41.

As shown in FIG. 2C, a metal plating process is performed. An electroplating layer 50 is formed on the metal foil layer 21 of the first surface 11 of the wiring substrate 10, the metal foil layer 41 of the second surface 12 of the wiring substrate 10, and an inner wall 101 of the at least one through hole 100. In this embodiment, the combination of metal foil layer 21 and electroplating layer 50 on the first surface 11 can be regarded as the aforementioned first metal layer 20, and the combination of metal foil layer 41 and electroplating layer 50 on the second surface 12 can be regarded as the aforementioned second metal layer 40, and the thickness of the electroplating layer 50 is preferably 3-5 µm. Preferably, the metal foil layers 21 and 41 and the electroplating layer 50 are made of the same metal material, such as copper.

The steps shown in FIGS. 2A to 2C are about completing the dispositions of the conductive through holes 100 in the wiring substrate 10 of the double-sided circuit board. Next, please refer to FIGS. 2D to 2F which are about completing the formation of wires on the first surface 11 and the second surface 12 of the wiring substrate 10.

Figure 2D:
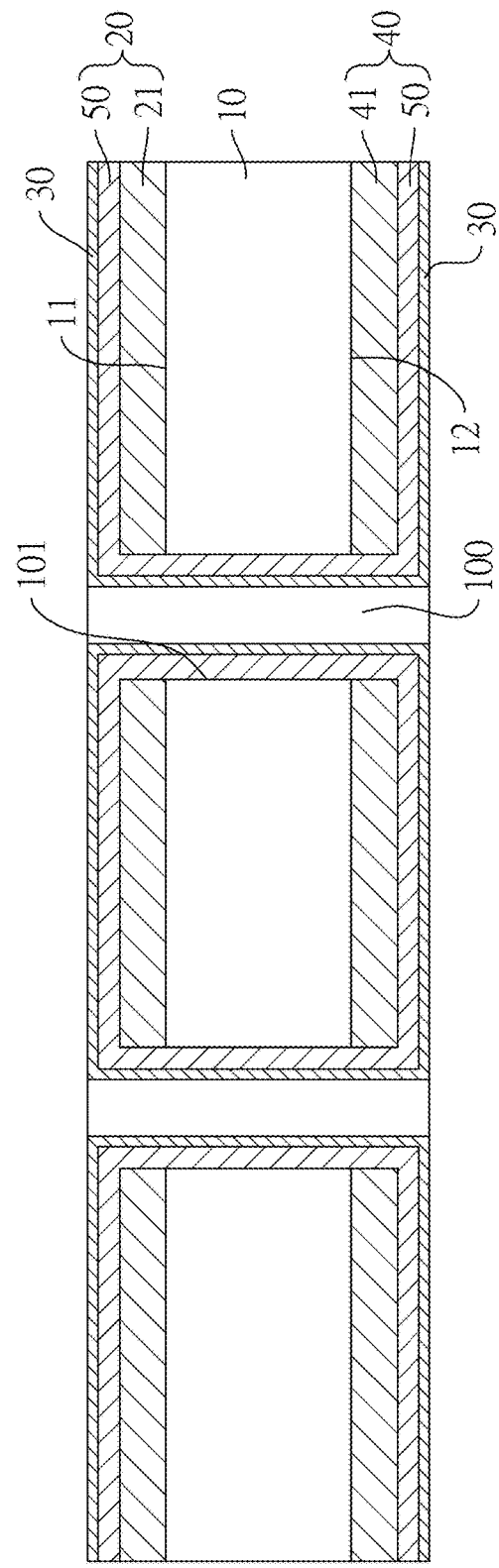

As shown in FIG. 2D, in this embodiment, when the resist film 30 is disposed on the surface of the first metal layer 20 of the wiring substrate 10 (i.e. the surface of the electroplating layer 50 of the first surface 11), simultaneously, the resist film 30 is also disposed on the surface of the second metal layer 40 (i.e. the surface of the electroplating layer 50 of the second surface 12), and the electroplating layer 50 of an inner wall 101 in the at least one through hole 100. The resist film 30 is disposed by, e.g. electroplating or electroless plating.

Preferably, the resist film 30, the metal foil layers 21 and 41 and the electroplating layer 50 are made of different metal materials. For example, the metal foil layers 21 and 41 and the electroplating layer 50 are copper metal, and the resist film 30 is made of metals such as tin, nickel, etc. or alloys thereof; however, the present invention is not limited thereto. Since the wiring substrate 10 and the first metal layer 20 thereon are immersed in an etching solution in a wet etching process, the etching is likely to etch certain kinds of metals, for example copper metal used as the first metal layer 20. In order to prevent etching of specific areas, the resist film 30 and the metal foil layers 21 and 41 and the electroplating layer 50 are made of different materials.

As shown in FIG. 2E. In this embodiment, when performing the step of the dry etching process, in addition to etching and penetrating the resist film 30 on the first metal layer 20, and forming the wiring pattern groove 200 in the first metal layer 20, the resist film 30 on the second surface of the wiring substrate 10 is also subjected to dry etching to form an opening 301 through the resist film 30 to form a wiring pattern groove 400 in the second metal layer 40. Wherein, on the first surface 11 or the second surface 12, the wiring pattern grooves 200 and 400 may either penetrate the electroplating layer 50 or not; however, at this moment, the wiring pattern grooves 200 and 400 do not penetrate the metal foil layers 21 and 41.

As shown in FIG. 2F, in this embodiment, in a step of performing the wet etching process, in addition to etching in the wiring pattern groove 200 of the first metal layer 20, the second metal layer 40 is further etched via the wiring pattern groove 400 of the second metal layer 40 to penetrate the second metal layer 40, and to form wires in the second metal layer 40, and the wires in the first metal layer 20 are electrically connected to the wires in the second metal layer 40 by the electroplating layer 50 on the inner wall 101 of the at least one through hole 100.

Figure 2G:
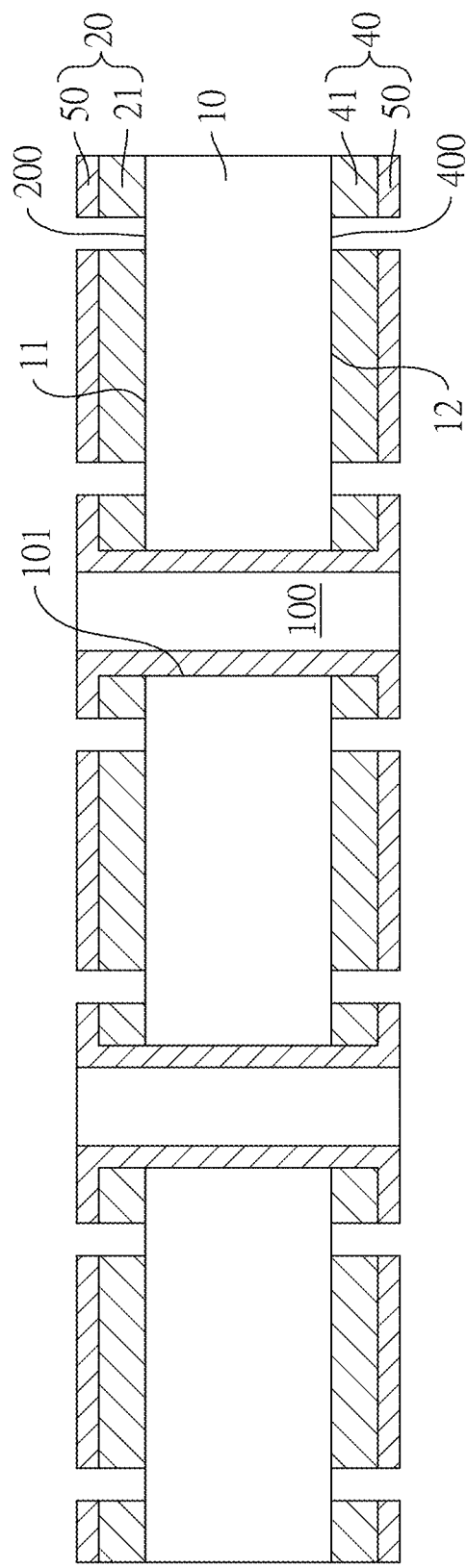

Finally, as shown in FIG. 2G, the resist film 30 is removed.

In the previous step as shown in FIG. 2E, if the wiring pattern grooves 200 and 400 penetrate the electroplating layer 50, the wet etching process shall continue to etch and penetrate the metal foil layers 21 and 41. If the wiring pattern grooves 200 and 400 do not penetrate the electroplating layer 50, the wet etching process shall firstly etch and penetrate the electroplating layer 50, and then continue to etch and penetrate the metal foil layers 21 and 41.

It should be noted that the characteristics of the metal foil layer 41, the electroplating layer 50, and the wiring pattern groove 400 of the second metal layer 40 are the same as those of the metal foil layer 41, the electroplating layer 50, and the wiring pattern groove 200 of the first metal layer 20, hence their characteristics are not repeated here.

Preferably, the wiring substrate 10 is, for example, a hard wiring substrate, a soft wiring substrate or a soft-and-hard compound wiring substrate. In addition, the wiring substrate 10 can also be a multilayer wiring substrate with a composite wiring structure, including a plurality of laminated dielectric layers, wiring layers, etc.

The aforementioned are preferred embodiments of the present invention. It should be noted that for those of ordinary skill in the art, without departing from the principles of the present invention, certain improvements and retouches of the present invention can still be made, which are nevertheless considered as within the protection scope of the present invention.

What is claimed is:

1. A subtractive method for manufacturing a circuit board with fine interconnect, comprising:
    preparing a wiring substrate, including disposing a metal foil layer on a first surface of the wiring substrate;
    performing a drilling process to form at least one through hole penetrating through the wiring substrate and the metal foil layer on the first surface;
    performing a metal plating process to form an electroplating layer on the metal foil layer of the first surface of the wiring substrate and on an inner wall of the at least one through hole, wherein both the metal foil layer and the electroplating layer on the first surface are combined as a first metal layer;
    disposing a resist film on the first metal layer and on the inner wall of the at least one through hole, the resist film being made of a metal material different from metal materials of which the metal foil layer and the electroplating layer are made;
    performing a laser dry etching process to etch from a surface of the resist film towards the first surface to form an opening corresponding to a first wiring pattern, the opening penetrating the resist film and forming a first wiring pattern groove in the first metal layer, wherein a depth of the first wiring pattern groove is less than a thickness of the first metal layer;
    performing a wet etching process to etch and penetrate the first metal layer from the first wiring pattern groove of the first metal layer to form wirings in the first metal layer; and
    removing the resist film.

2. The subtractive method as claimed in claim 1, wherein
    the preparing of the wiring substrate further includes disposing the metal foil layer on a second surface of the wiring substrate opposite to the first surface of the wiring substrate,
    in the drilling process, the at least one through hole also penetrates through the metal foil layer on the second surface,
    in the metal plating process, to form an electroplating layer is also formed on the metal foil layer of the second surface of the wiring substrate, and
    the metal foil layer and the electroplating layer on the second surface are combined as a second metal layer.

3. The subtractive method as claimed in claim 2, wherein,
    in the disposing of the resist film on the first metal layer, the resist film is simultaneously disposed on a surface of the second metal layer;
    in the laser dry etching process,
        the resist film on the second surface of the wiring substrate is laser dry etched to form an opening corresponding to a second wiring pattern,
        the opening penetrates the resist film on the second metal layer, to form a second wiring pattern groove in the second metal layer, and
        a depth of the second wiring pattern groove in the second metal layer is smaller than a thickness of the second metal layer; and
    in the wet etching process, the second metal layer is further etched from the second wiring pattern groove in the second metal layer to penetrate the second metal layer, so as to form wirings in the second metal layer; and
    the wirings in the first metal layer are electrically connected to the wirings in the second metal layer via the electroplating layer in the inner wall of the at least one through hole.

4. The subtractive method as claimed in claim 3, wherein, in the laser dry etching process, as the first wiring pattern groove is formed in the first metal layer, and the second wiring pattern groove is formed in the second metal layer, at least one of the first wiring pattern groove on the first surface and the second wiring pattern groove on the second surface penetrates the electroplating layer.

5. The subtractive method as claimed in claim 3, wherein, in the laser dry etching process, as the first wiring pattern groove is formed in the first metal layer, and the second wiring pattern groove is formed in the second metal layer, at least one of the first wiring pattern groove on the first surface of the wiring substrate and the second another wiring pattern groove on the second surface does not penetrate the electroplating layer.

6. The subtractive method as claimed in claim 1, wherein the wiring substrate includes a multilayer wiring substrate with a composite wiring structure.

7. The subtractive method as claimed in claim 1, wherein the wiring substrate is a hard wiring substrate, a soft wiring substrate, or a soft-and-hard compound wiring substrate.

* * * * *